United States Patent
Sekine

(10) Patent No.: US 9,287,318 B2
(45) Date of Patent: Mar. 15, 2016

(54) SOLID-STATE IMAGING SENSOR, METHOD OF MANUFACTURING THE SAME, AND CAMERA

(71) Applicant: CANON KABUSHIKI KAISHA, Tokyo (JP)

(72) Inventor: Yasuhiro Sekine, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/225,571

(22) Filed: Mar. 26, 2014

(65) Prior Publication Data

US 2014/0300788 A1    Oct. 9, 2014

(30) Foreign Application Priority Data

Apr. 8, 2013   (JP) .................................. 2013-080837

(51) Int. Cl.
*H01L 27/146*    (2006.01)

(52) U.S. Cl.
CPC ...... *H01L 27/14685* (2013.01); *H01L 27/1464* (2013.01); *H01L 27/14627* (2013.01)

(58) Field of Classification Search
CPC .......................... H01L 27/1464; H01L 27/1462
USPC .......... 348/241, 272, 294, 307, 308; 257/126, 257/127, 140, 170, 171, 228, 243, 244
See application file for complete search history.

(56) References Cited

U.S. PATENT DOCUMENTS

| 7,129,532 | B2 | 10/2006 | Lee |
| 7,202,103 | B2 | 4/2007 | Sekine et al. |
| 7,829,371 | B2 | 11/2010 | Ryu |
| 8,004,020 | B2 | 8/2011 | Kawasaki |
| 8,222,068 | B2* | 7/2012 | Ryu ................. H01L 27/14685 438/221 |
| 8,410,569 | B2 | 4/2013 | Yoshihara et al. |
| 2009/0185060 | A1* | 7/2009 | Akiyama .......... H01L 27/14623 348/294 |
| 2010/0148294 | A1 | 6/2010 | Fujii et al. |
| 2012/0086093 | A1* | 4/2012 | Otsuka ............. H01L 27/14621 257/432 |
| 2013/0222657 | A1* | 8/2013 | Shimotsusa ....... H01L 27/14601 348/294 |

FOREIGN PATENT DOCUMENTS

| JP | 2000-150843 A | 5/2000 |
| JP | 2000-164836 A | 6/2000 |
| JP | 2005-209677 A | 8/2005 |
| JP | 2005-277409 A | 10/2005 |
| JP | 2006-351761 A | 12/2006 |
| JP | 2008-227507 A | 9/2008 |

(Continued)

*Primary Examiner* — Twyler Haskins
*Assistant Examiner* — Peter Chon
(74) *Attorney, Agent, or Firm* — Fitzpatrick, Cella, Harper & Scinto

(57) ABSTRACT

A solid-state imaging sensor which has a first face and a second face, and includes an image sensing region and an electrode region, comprising a first portion including an insulating member and a wiring pattern, a second portion including a plurality of photoelectric conversion portions in the image sensing region, and a third portion including a plurality of microlenses in the image sensing region, wherein an opening is formed on the side of the first face in the electrode region so as to expose the wiring pattern, and the sensor includes a first film covering the plurality of microlenses, and a second film covering a side face of the opening and exposing part of the wiring pattern in the electrode region, with covering the first film in the image sensing region.

12 Claims, 5 Drawing Sheets

(56) References Cited

FOREIGN PATENT DOCUMENTS

| | | |
|---|---|---|
| JP | 2009-099804 A | 5/2009 |
| JP | 2009-283902 A | 12/2009 |
| JP | 2011-035038 A | 2/2011 |
| JP | 2013-089756 A | 5/2013 |

* cited by examiner

SOLID-STATE IMAGING SENSOR, METHOD OF MANUFACTURING THE SAME, AND CAMERA

BACKGROUND OF THE INVENTION

1. Field of the Invention

The present invention relates to a solid-state imaging sensor, a method of manufacturing the same, and a camera.

2. Description of the Related Art

A back-side illumination solid-state imaging sensor can be used in an image sensing system represented by a digital camera or the like. Since the back-side illumination solid-state imaging sensor is provided with, for example, a structure including insulating layers and wiring layers on the opposite side of the light incident side, it is more advantageous than a front-side illumination solid-state imaging sensor in that the light sensitivity of each photoelectric conversion portion improves.

Japanese Patent Laid-Open No. 2005-209677 discloses the structure of a back-side illumination solid-state imaging sensor which includes an opening, formed on the back side of a substrate, for providing an electrode (pad), and a protection film for covering the side faces of the opening. According to Japanese Patent Laid-Open No. 2005-209677, it is possible to prevent moisture absorption from the opening by covering the side faces of the opening with the protection film.

When performing etching to form an opening on the back side of the solid-state imaging sensor, a resist pattern can be formed. When removing the resist pattern, however, microlenses may get damaged. Furthermore, after performing etching, a microlens array may get damaged due to an external environment.

SUMMARY OF THE INVENTION

The present invention has been made in recognition of the above problem by the inventor, and provides a technique advantageous in improving the reliability of a back-side illumination solid-state imaging sensor.

One of the aspects of the present invention provides a solid-state imaging sensor which has a first face and a second face on an opposite side of the first face, and includes an image sensing region in which a plurality of photoelectric conversion portions are arrayed and an electrode region, comprising: in a direction from the second face to the first face, a first portion including an insulating member and a wiring pattern provided in the insulating member; a second portion including the plurality of photoelectric conversion portions in the image sensing region; and a third portion including a plurality of microlenses corresponding to the plurality of photoelectric conversion portions in the image sensing region, wherein an opening is formed on the side of the first face in the electrode region so that the wiring pattern is exposed, and the solid-state imaging sensor includes a first film provided to cover the plurality of microlenses in the image sensing region, and a second film configured to cover a side face of the opening and expose at least part of the wiring pattern in the electrode region while covering the first film in the image sensing region.

Further features of the present invention will become apparent from the following description of exemplary embodiments with reference to the attached drawings.

DESCRIPTION OF THE EMBODIMENTS (Example of Circuit Arrangement of Solid-State Imaging Sensor)

Figure 1:
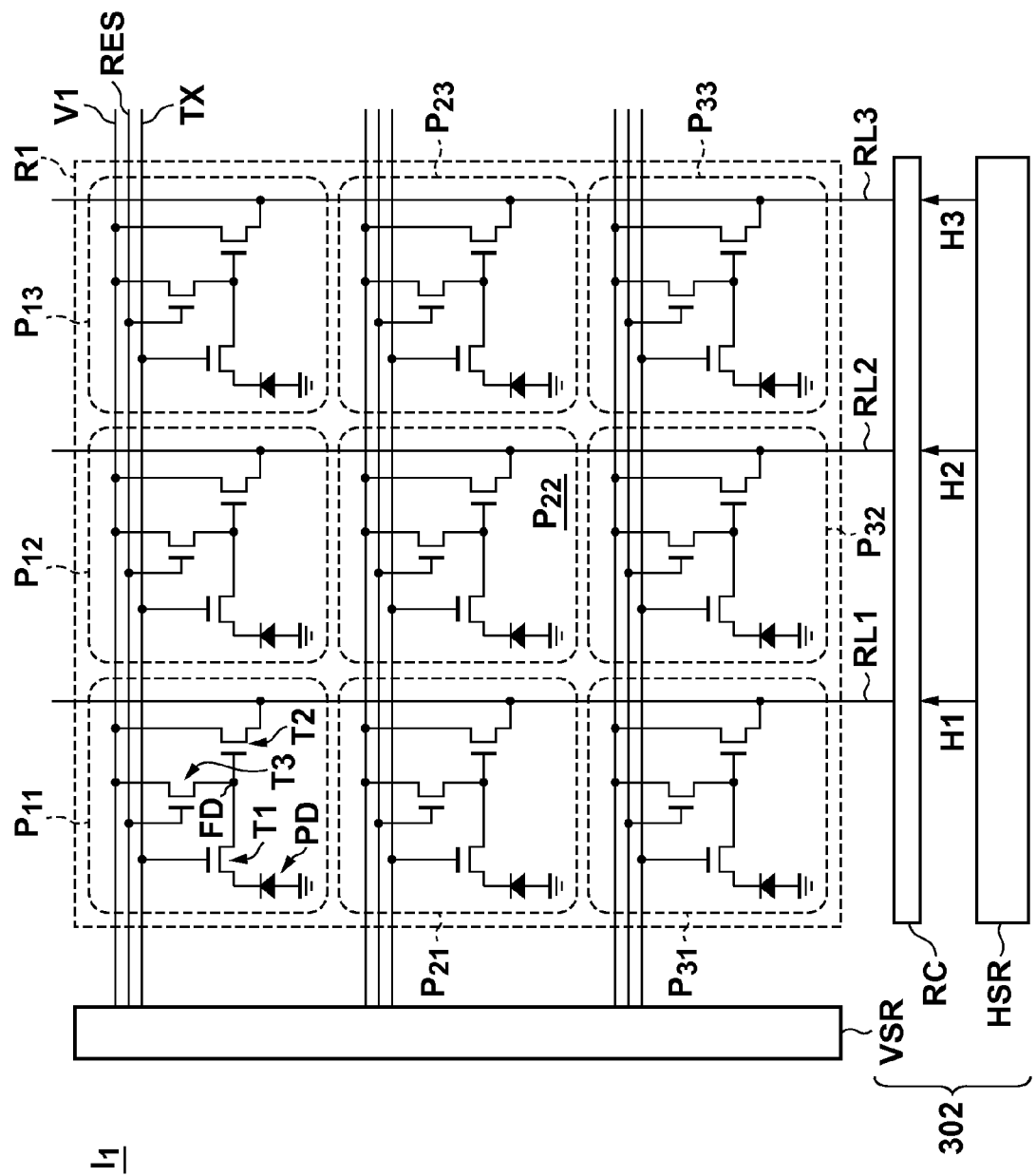
FIG. 1 is a circuit diagram for explaining an example of the circuit arrangement of a solid-state imaging sensor.

An example of the circuit arrangement of a solid-state imaging sensor $I_1$ according to the present invention will be described with reference to FIG. 1. The solid-state imaging sensor $I_1$ can include a plurality of pixels P and a peripheral circuit unit 302 for reading out a pixel signal from each pixel P. The plurality of pixels P can be arranged in an image sensing region R1. The pixels P ($P_{11}$ to $P_{33}$) arrayed in 3 rows×3 columns are exemplified for descriptive convenience. The peripheral circuit unit 302 can include a vertical scanning circuit VSR, a horizontal scanning circuit HSR, and a readout circuit RC.

Each pixel P can have a known circuit arrangement. For example, the pixel $P_{11}$ can include a photoelectric conversion portion PD (for example, a photodiode), a transfer transistor T1, a floating diffusion capacitor FD, a source follower transistor T2, and a reset transistor T3. A control signal TX is supplied to the gate terminal of the transfer transistor T1. When the control signal TX is activated, the transfer transistor T1 transfers, to the floating diffusion capacitor FD, charges which have been generated upon receiving light and accumulated in the photoelectric conversion portion PD. The amount of a current flowing to the source follower transistor T2 changes according to a change in charge amount transferred to the floating diffusion capacitor FD, and a pixel signal corresponding to the current amount can be output to a column signal line RL1. A control signal RES is supplied to the gate terminal of the reset transistor T3. When the control signal RES is activated, the reset transistor T3 can reset the potential of the floating diffusion capacitor FD. The same goes for the remaining pixels P ($P_{12}$ to $P_{33}$). Note that the one pixel $P_{11}$ may include a plurality of photoelectric conversion portions PD.

The vertical scanning circuit VSR can supply a power supply voltage V1 to each pixel P, and output the control signals TX and RES to each pixel P. In response to the control signals from the vertical scanning circuit VSR, pixel signals are output from the respective pixels P for each row. In response to a control signal H (H1 to H3) from the horizontal scanning circuit HSR, the readout circuit RC can output and read out the pixel signals for each column.

(Example of Overall Arrangement of Solid-Stare Imaging Sensor)

Figure 2:
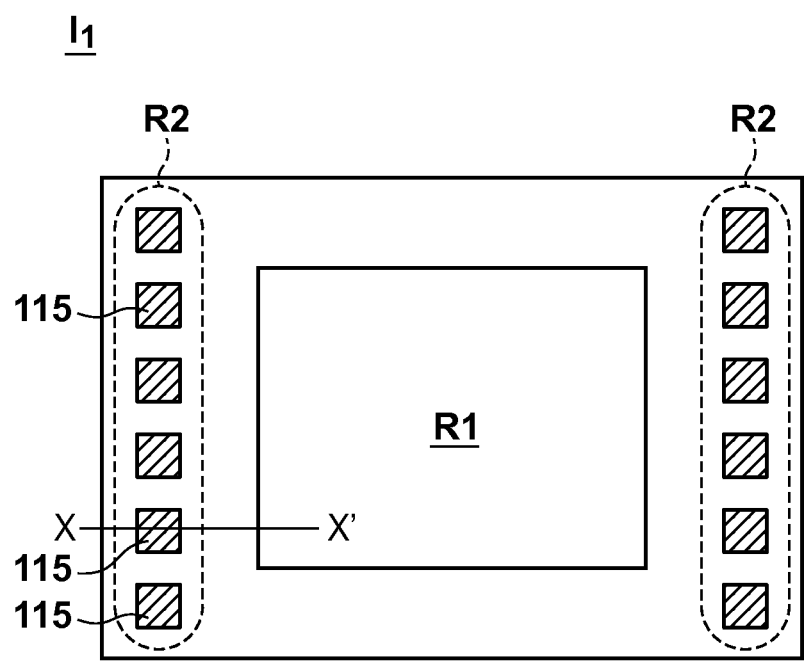
FIG. 2 is a view for explaining an example of the overall arrangement of the solid-state imaging sensor.

An example of the overall arrangement of the solid-state imaging sensor $I_1$ will be described with reference to FIG. 2. FIG. 2 schematically shows the two-dimensional layout of the solid-state imaging sensor $I_1$. The solid-state imaging sensor $I_1$ can include the image sensing region R1 in which the plurality of pixels P are arrayed and an electrode region R2 in which electrodes 115 are arranged. For example, the solid-state imaging sensor $I_1$ is externally supplied with a power supply voltage or inputs/outputs a signal from/to the outside via each electrode 115 in the electrode region R2. Note that the above-described peripheral circuit unit 302 can be arranged in a region other than the image sensing region R1 and the electrode region R2.

(Example of Sectional Structure of Solid-State Imaging Sensor)

Figure 3:
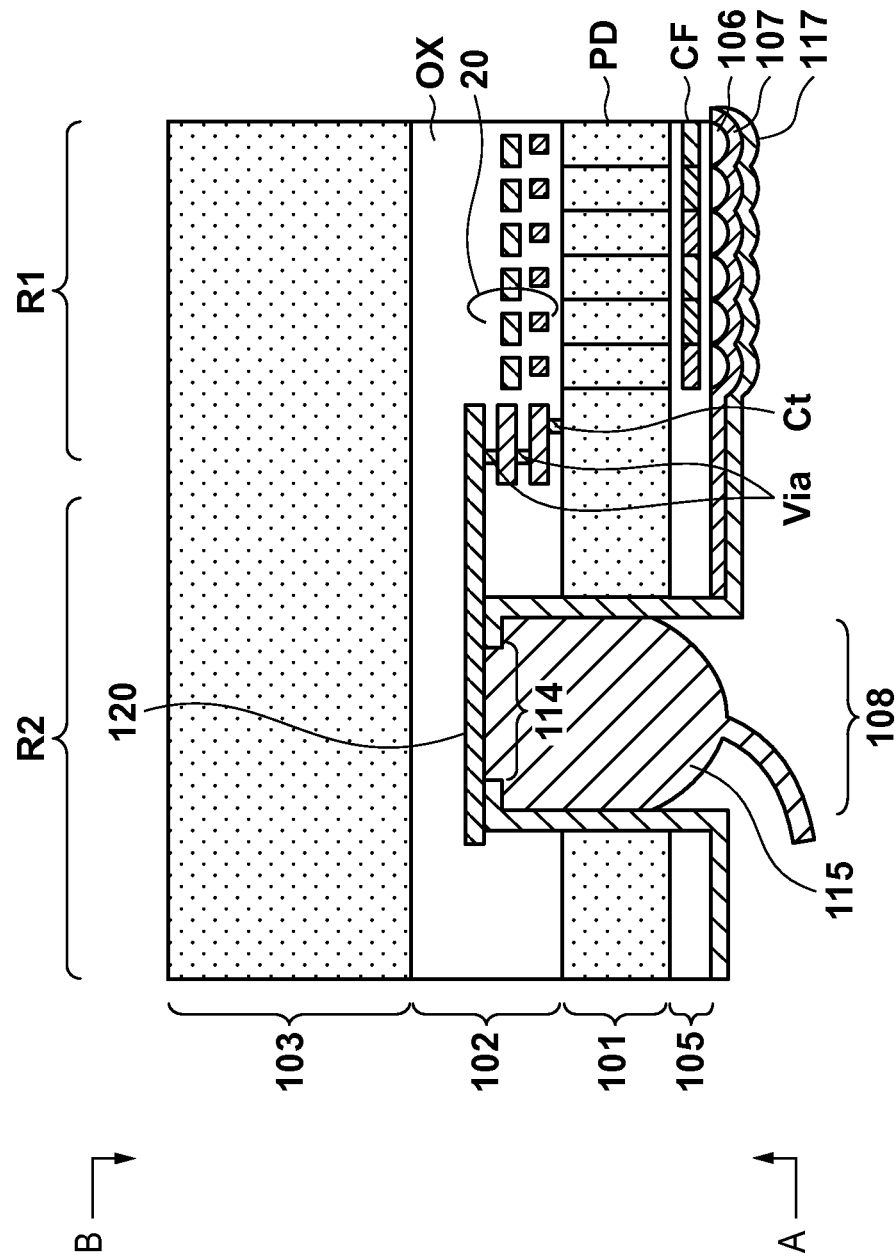
FIG. 3 is a sectional view for explaining an example of the structure of the solid-state imaging sensor according to the present invention.

FIG. 3 schematically shows the sectional structure of the solid-state imaging sensor $I_1$ along a cut line X-X' shown in FIG. 2. The solid-state imaging sensor $I_1$ has a back-side illumination arrangement, and includes a face A (first face) on the light incident side and a face B (second face) on the opposite side of the face A. The solid-state imaging sensor $I_1$ includes, from the face B toward the face A, a base 103, a portion 102 including an insulating member OX and a plurality of wiring patterns 20, a portion 101 formed by a semiconductor, and a portion 105 formed by a translucent member. The base 103 is a substrate bonded to the portion 102, and supports the portion 102. For example, silicon can be used for the base 103.

The portion 102 (first portion) can have, for example, a stacked structure in which an insulating layer and a wiring layer are alternately provided. The wiring pattern 20 formed in each wiring layer can be electrically connected to the wiring pattern in the immediately upper or lower wiring layer through a via Via. An insulating material such as silicon oxide or silicon nitride can be used for the insulating member OX. A metal such as Al or Cu can be used for the wiring pattern. One of the plurality of wiring patterns 20, which should be connected to the electrode 115, is formed from the image sensing region R1 to the electrode region R2, and represented by a wiring pattern 120.

The portion 101 (second portion) includes the photoelectric conversion portions PD provided to respectively correspond to the pixels P in the image sensing region R1. The wiring pattern 20 formed in one of the plurality of wiring layers in the portion 102, which is closest to the portion 101, can be connected to, for example, an impurity diffusion region (not shown) of the semiconductor of the portion 101 via a contact Ct. For example, silicon can be used for the semiconductor forming the portion 101.

The portion 105 (third portion) includes microlenses 106 provided to respectively correspond to the pixels P in the image sensing region R1. The portion 105 can include color filters CF provided to respectively correspond to the pixels P. The color filters CF can be provided according to, for example, the Bayer arrangement. Note that if the pixel P includes a plurality of photoelectric conversion portions, one microlens 106 may be provided for the plurality of photoelectric conversion portions or each photoelectric conversion portion.

In the electrode region R2, an opening 108 is formed on the face A side so that the wiring pattern 120 is exposed. The solid-state imaging sensor $I_1$ includes a first film 107 which is provided to cover the respective microlenses 106 in the image sensing region R1. An inorganic material such as silicon oxide, silicon nitride, or silicon oxynitride can be used for the first film 107.

The solid-state imaging sensor $I_1$ includes a second film 117 which covers the side faces of the opening 108 and exposes at least part 114 of the wiring pattern 120 in the electrode region R2 while covering the first film 107 in the image sensing region R1. An insulating inorganic material such as silicon oxide, silicon nitride, or silicon oxynitride can be used for the second film 117.

The first film 107 and the second film 117 are stacked to cover the respective microlenses 106, and can function as a protection layer for the respective microlenses 106. Furthermore, the first film 107 and the second film 117 can be provided to function as an antireflection film. The antireflection characteristic of the antireflection film can be improved by using members having different refractive indices for the first film 107 and the second film 117, as compared with a case in which members having the same refractive index are used for those films. For example, a member having a refractive index higher than that of the second film 117 is used for the first film 107. For example, silicon nitride (a refractive index of 1.7 to 2.0) can be used for the first film 107, and silicon oxide (a refractive index of 1.4 to 1.5) can be used for the second film 117.

Furthermore, the solid-state imaging sensor $I_1$ includes the electrode 115 provided in the opening 108 in the electrode region R2. The electrode 115 contacts the part 114 of the wiring pattern 120 exposed by the opening of the second film 117. The electrode 115 is formed by, for example, bonding, bump formation, or plating. The electrode 115 can be formed using a metal such as gold, silver, copper, or aluminum.

In the solid-state imaging sensor $I_1$, the first film 107 and the second film 117 are stacked to cover the respective microlenses 106, and can function as a protection film and an antireflection film. Furthermore, the second film 117 covers the side faces of the opening 108, so that the electrode 115 is electrically insulated from the semiconductor of the portion 101. That is, the second film 117 prevents a short circuit between the electrode 115 and the semiconductor (portion 101). According to the present invention, therefore, it is possible to improve the reliability of the solid-state imaging sensor $I_1$.

The present invention is not limited to the above embodiment. Changes can be appropriately made in accordance with the purpose, state, application, function, and other specifications, and the present invention can also be implemented by another embodiment. For example, the arrangement in which the wiring pattern 120 is arranged in one of the plurality of wiring layers in the portion 102, that is closest to the base 103, has been exemplified. The present invention, however, is not limited to this.

(Example of Method of Manufacturing Solid-State Imaging Sensor)

The solid-state imaging sensor $I_1$ can be manufactured using a known semiconductor manufacturing process. An example of a method of manufacturing the solid-state imaging sensor $I_1$ will be described with reference to FIGS. 4A to 4H.

Figure 4A:
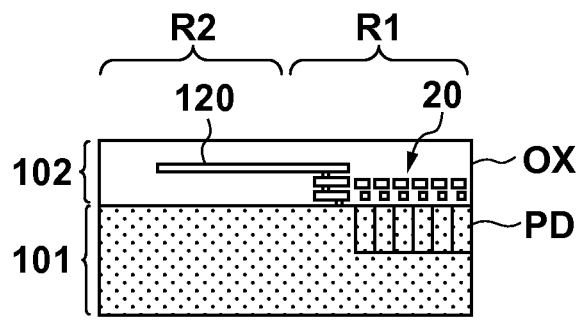
FIGS. 4A to 4H are views for explaining an example of a method of manufacturing the solid-state imaging sensor according to the present invention.

As exemplified in FIG. 4A, photoelectric conversion portions PD are formed on a semiconductor substrate made of, for example, silicon, thereby obtaining a portion 101. Although not shown, in addition to the photoelectric conversion portions PD, respective elements (MOS transistors) and element isolation regions (STI and the like) can be provided on the semiconductor substrate. A portion 102 including an insulating member OX and a plurality of wiring patterns 20 in the insulating member OX is formed on the portion 101. The portion 102 can be formed by, for example, alternately providing an insulating layer and a wiring layer. In this example, a structure including three wiring layers is exemplified. For example, copper is used for the wiring pattern in the wiring layer, and a damascene method can be used for wiring formation. One (the wiring pattern 120 in this example) of the plurality of wiring patterns 20, which should be connected to the electrode 115 later, is made of, for example, aluminum, and formed from an image sensing region R1 to an electrode region R2.

Figure 4B:
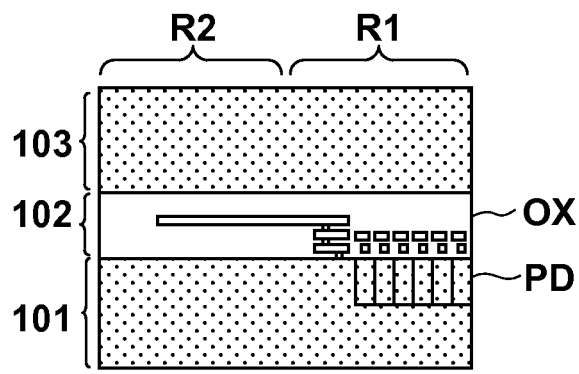

As exemplified in FIG. 4B, a base 103 made of, for example, silicon is provided on the portion 102. The upper face (face B side) of the portion 102 is planarized by CMP or the like, and the lower face (face A side) of the base 103 is also planarized. The portion 102 and the base 103 can be joined by bonding. An adhesive may or may not be used for bonding. Bonding is preferably performed in a vacuum or an inert gas atmosphere. Furthermore, before bonding, the upper face of the portion 102 and the lower face of the base 103 are preferably irradiated with a plasma. This can increase the strength of bonding between the portion 102 and the base 103. Note that a chemical treatment may be performed, instead of plasma irradiation. If an adhesive is used for bonding, the upper face of the portion 102 and the lower face of the base 103 need not be planarized, as compared with a case in which no adhesive is used. For example, benzocyclobutene or the like is preferably used as an adhesive to perform bonding at a temperature of about 250° C. Note that a glass substrate may be used as the base 103, instead of the silicon substrate.

Figure 4C:
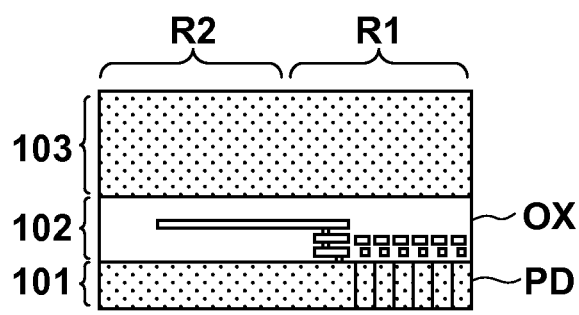

As exemplified in FIG. 4C, the portion 101 is thinned by polishing the lower face (face A side) of the portion 101 by grinding, CMP, or the like. This allows incident light from microlenses 106, which will be provided in the portion 105 later, to efficiently enter the photoelectric conversion portions PD. The thickness of the portion 101 is smaller than that of the base 103. Note that the thickness of the thinned portion 101 and that of the portion 102 (the stacked structure including the insulating layers and wiring layers) are, for example, about several μm, respectively.

Figure 4D:
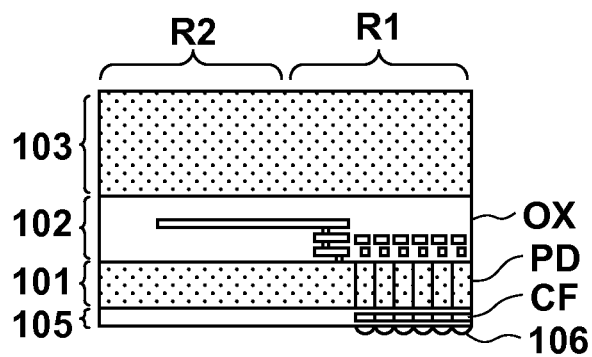

As exemplified in FIG. 4D, a portion 105 including the microlens 106 and color filters CF which are respectively provided to correspond to the respective pixels P in the image sensing region R1 is formed on the lower face of the portion 101. The portion 105 can be obtained by sequentially forming, for example, a planarization layer (not shown), color filters CF, a second planarization layer (not shown), and microlenses 106 from the face B side toward the face A side.

Figure 4E:
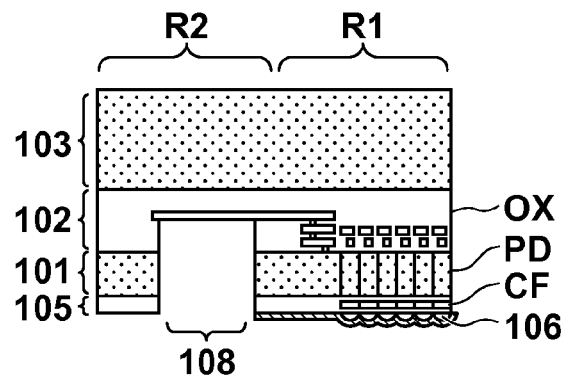

As exemplified in FIG. 4E, a first film 107 is formed to cover the respective microlenses 106 in the image sensing region R1. An inorganic material such as silicon oxide, silicon nitride, or silicon oxynitride can be used for the first film 107. After that, an opening 108 is formed from the face A side of the portion 105 in the electrode region R2. The opening 108 can be formed by removing the portion 105, the portion 101, and part of the portion 102 by, for example, etching using a dry etching method so as to expose the wiring pattern 120. To perform etching, a resist pattern (not shown) can be formed in a region other than that to undergo etching.

In this case, the first film 107 is formed to cover the microlenses 106, and functions as a protection film, thereby avoiding damage to the microlenses 106 when removing the resist pattern after etching. In particular, since the deep opening 108 is formed by etching to expose the wiring pattern 120, damage to the resist pattern due to the etching is large. It is, therefore, necessary to ash the resist pattern or use a releasing liquid with a high capability of releasing the resist pattern. Thus, it is difficult to remove the resist pattern, as compared with a normal case. On the other hand, according to this manufacturing method, the first film 107 functions as a protection film, thereby avoiding damage to the microlenses 106 due to removal of the resist pattern.

Note that the wiring pattern 120 can be formed in a rectangular shape having a side of, for example, about 50 to 100 μm. The opening 108 can be formed in a size smaller than that of the wiring pattern 120. If, for example, a side of the wiring pattern 120 is 100 μm, the opening 108 can be formed to have a side of about 90 μm. FIG. 2 shows the wiring pattern 120 and the opening 108 each having a square shape. The present invention, however, is not limited to this.

Figure 4F:
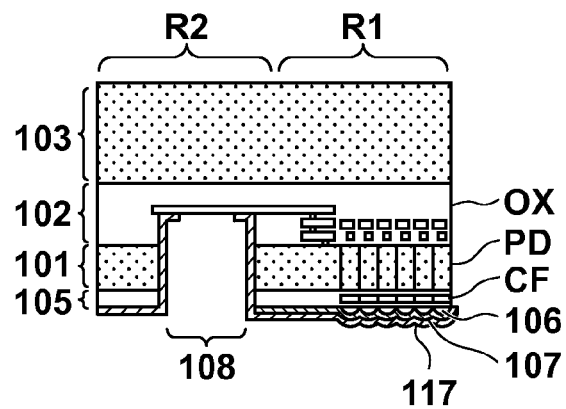

As exemplified in FIG. 4F, a second film 117 is formed to cover the opening 108 in the electrode region R2 while covering the first film 107. An insulating inorganic material such as silicon oxide, silicon nitride, or silicon oxynitride can be used for the second film 117. Since the second film 117 can function as a passivation film for the side faces of the opening 108, silicon nitride or silicon oxynitride may be used.

Figure 4G:
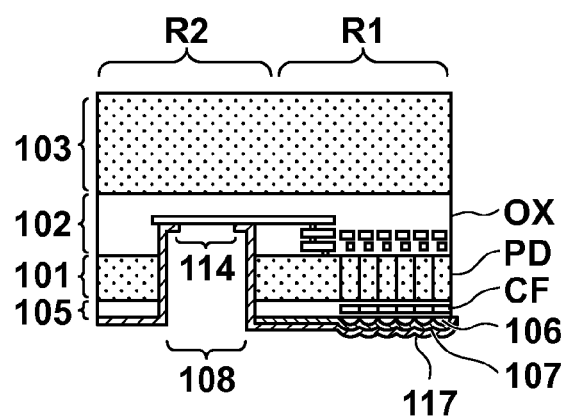

As exemplified in FIG. 4G, an opening 114 is formed by removing part of the second film 117 so as to expose at least part of the wiring pattern 120. The opening 114 can be formed by, for example, patterning and etching.

Figure 4H:
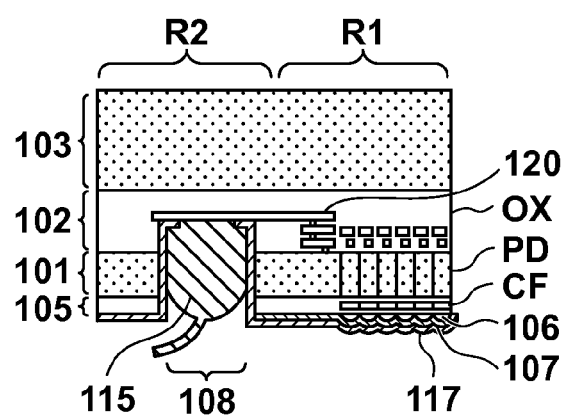

As exemplified in FIG. 4H, an electrode 115 is formed in the opening 108. The electrode 115 is formed to contact the wiring pattern 120 through the opening 114. For example, a metal such as gold, silver, copper, or aluminum can be used for the electrode 115. Since the second film 117 is formed to cover the side faces of the opening 108, the electrode 115 is electrically insulated from the semiconductor of the portion 101, thereby preventing a short circuit between the electrode 115 and the semiconductor (portion 101).

The solid-state imaging sensor $I_1$ is obtained by the above-described manufacturing method. The method of manufacturing the solid-state imaging sensor $I_1$ is not limited to the above one. It is also possible to manufacture the solid-state imaging sensor $I_1$ by another method using a known semiconductor manufacturing process.

(Image Sensing System)

In the above embodiment, the solid-state imaging sensor $I_1$ included in an image sensing system represented by a camera or the like has been explained. The image sensing system conceptually includes not only a device whose principal purpose is shooting but also a device (for example, a personal computer or portable terminal) additionally provided with a shooting function. The image sensing system can include the solid-state imaging sensor $I_1$ according to the present invention, which has been exemplified in the above embodiment, and a processing unit for processing a signal output from the solid-state imaging sensor $I_1$. The processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-080837, filed Apr. 8, 2013, which is hereby incorporated by reference herein in its entirety.

What is claimed is:

1. A solid-state imaging sensor which has a first face and a second face on an opposite side of the first face, and includes an image sensing region in which a plurality of photoelectric conversion portions are arrayed and an electrode region, comprising:

in a direction from the second face to the first face, a first portion including an insulating member and a wiring pattern provided in the insulating member;

a second portion including the plurality of photoelectric conversion portions in the image sensing region; and a third portion including a plurality of microlenses corresponding to the plurality of photoelectric conversion portions in the image sensing region, wherein an opening is formed on the side of the first face in the electrode region so that the wiring pattern is exposed, and the solid-state imaging sensor includes
- a first film provided to cover the plurality of microlenses in the image sensing region and to not cover a side face of the opening, and
- a second film provided to cover the side face of the opening and expose at least part of the wiring pattern in the electrode region while covering the first film in the image sensing region.

2. The sensor according to claim 1, further comprising an electrode provided in the opening to contact the at least part of the wiring pattern in the electrode region.

3. The sensor according to claim 1, wherein the first film and a portion of the second film, which covers the first film, form an antireflection film configured to cover the plurality of microlenses.

4. The sensor according to claim 1, wherein the first film has a refractive index higher than that of the second film.

5. The sensor according to claim 1, wherein the first film is made of silicon nitride, and the second film is made of silicon oxide.

6. The sensor according to claim 1, wherein the first film and the second film are made of at least one of silicon oxide, silicon nitride, and silicon oxynitride.

7. The sensor according to claim 1, further comprising:
- a base provided between the second face and the first portion,
- wherein the base has a thickness larger than a thickness of the second portion.

8. A camera comprising:
- a solid-state imaging sensor according to claim 1; and
- a processor configured to process a signal output from the solid-state imaging sensor.

9. The sensor according to claim 1, wherein
the first film and part of the second film, which covers the first film, form an antireflection film configured to cover the plurality of microlenses, and
another part of the second film, which covers the side face of the opening functions as a passivation film for the side face of the opening.

10. The sensor according to claim 1, wherein the second film, in the opening, is directly in contact with a semiconductor region, of the second portion, in which the plurality of photoelectric conversion portions are formed.

11. The sensor according to claim 1, wherein the first film has a side face which is on the same face as the side face of the opening.

12. A method of manufacturing a solid-state imaging sensor which has a first face and a second face on an opposite side of the first face, and includes an image sensing region in which a plurality of photoelectric conversion portions are arrayed and an electrode region,
the solid-state imaging sensor including, from a side of the second face toward a side of the first face, a first portion including an insulating member and a wiring pattern provided in the insulating member, a second portion including the plurality of photoelectric conversion portions in the image sensing region, and a third portion including a plurality of microlenses corresponding to the plurality of photoelectric conversion portions in the image sensing region,
the method comprising:
forming a first film to cover the plurality of microlenses in the image sensing region;
forming an opening on the side of the first face in the electrode region so that the wiring pattern is exposed, with removing part of the first film; and
forming a second film to cover a side face of the opening and expose at least part of the wiring pattern in the electrode region while covering another part of the first film which remains in the image sensing region.

* * * * *